(12) United States Patent
Wang et al.

(10) Patent No.: US 10,190,905 B2
(45) Date of Patent: *Jan. 29, 2019

(54) OPTICAL SENSOR ARRANGEMENT WITH OPTICAL BARRIER FOR PASSING LIGHT EMITTED BY LIGHT EMITTING DEVICE AND SCATTERED ON OR ABOVE AN OUTER SURFACE OF COVER

(71) Applicant: ams AG, Unterpremstaetten (AT)

(72) Inventors: Yu Wang, Plano, TX (US); David Mehrl, Plano, TX (US); Greg Stoltz, Flower Mound, TX (US); Kerry Glover, Rockwall, TX (US); Tom Dunn, Dallas, TX (US)

(73) Assignee: ams AG, Unterpremstaetten (AT)

( * ) Notice: Subject to any disclaimer, the term of this patent is extended or adjusted under 35 U.S.C. 154(b) by 124 days.

This patent is subject to a terminal disclaimer.

(21) Appl. No.: 15/119,113

(22) PCT Filed: Feb. 13, 2015

(86) PCT No.: PCT/EP2015/053107
§ 371 (c)(1),
(2) Date: Aug. 15, 2016

(87) PCT Pub. No.: WO2015/121420
PCT Pub. Date: Aug. 20, 2015

(65) Prior Publication Data
US 2017/0052064 A1    Feb. 23, 2017

Related U.S. Application Data

(60) Provisional application No. 61/940,640, filed on Feb. 17, 2014.

(30) Foreign Application Priority Data

Feb. 28, 2014 (EP) .................... 14157279

(51) Int. Cl.
*G01J 1/02* (2006.01)
*G01S 17/02* (2006.01)
(Continued)

(52) U.S. Cl.
CPC .......... *G01J 1/0214* (2013.01); *G01S 7/4813* (2013.01); *G01S 17/026* (2013.01); *G01V 8/12* (2013.01);
(Continued)

(58) Field of Classification Search
CPC ..... G01S 17/026; G01S 7/4813; G02B 5/003; G01J 1/0214; G01J 3/0262; G01V 8/12; H01L 31/173
(Continued)

(56) References Cited

U.S. PATENT DOCUMENTS 8,232,541 B2 * 7/2012 Wiese ................ H01L 25/167
250/239
8,704,152 B2   4/2014 Svajda et al.
(Continued)

FOREIGN PATENT DOCUMENTS

CN    101936752 A    1/2011
CN    102364358 A    2/2012
(Continued)

*Primary Examiner* — Que T Le
(74) *Attorney, Agent, or Firm* — Fish & Richardson P.C.

(57) ABSTRACT

An optical sensor arrangement comprises an optical barrier which is placed between a light-emitting device and a photodetector. Herein the light-emitting device and the photodetector are arranged on a first plane and are covered by a cover. The photodetector exhibits an active zone. The optical barrier exhibits an extent along a first principal axis, which is pointing parallel to the line connecting the centers of the light-emitting device and the photodetector. Herein the extent is greater than a dimension of the active zone. The optical barrier is designed to block light emitted by the (Continued)

light-emitting device that otherwise would be reflected by the cover by means of specular reflection and would reach the photodetector. The optical barrier is designed to pass light emitted by the light-emitting device and scattered on or above an outer surface of the cover.

16 Claims, 3 Drawing Sheets

(51) Int. Cl.
  *H03K 17/94* (2006.01)
  *G01S 7/481* (2006.01)
  *G01V 8/12* (2006.01)
  *H01L 31/173* (2006.01)

(52) U.S. Cl.
  CPC ......... *H01L 31/173* (2013.01); *H03K 17/941* (2013.01); *H03K 2217/94108* (2013.01)

(58) Field of Classification Search
  USPC ............................ 250/214 AL, 216, 239, 551
  See application file for complete search history.

(56) References Cited

U.S. PATENT DOCUMENTS

| | | |
|---|---|---|
| 8,957,380 B2 | 2/2015 | Costello et al. |
| 2008/0006762 A1 | 1/2008 | Fadell et al. |
| 2008/0296478 A1 | 12/2008 | Hernoult |
| 2010/0124945 A1 | 5/2010 | Hwang et al. |
| 2010/0258710 A1 | 10/2010 | Wiese et al. |
| 2011/0057130 A1 | 3/2011 | Hsu et al. |
| 2011/0186736 A1 | 8/2011 | Yao et al. |
| 2011/0204233 A1 | 8/2011 | Costello et al. |
| 2011/0248151 A1 | 10/2011 | Holcombe et al. |
| 2011/0297832 A1 | 12/2011 | Yao et al. |
| 2012/0129579 A1 | 5/2012 | Tam |
| 2012/0295665 A1 | 11/2012 | Pantfoerder |

FOREIGN PATENT DOCUMENTS

| | | |
|---|---|---|
| EP | 2728387 A | 5/2014 |
| EP | 2735891 A1 | 5/2014 |

* cited by examiner

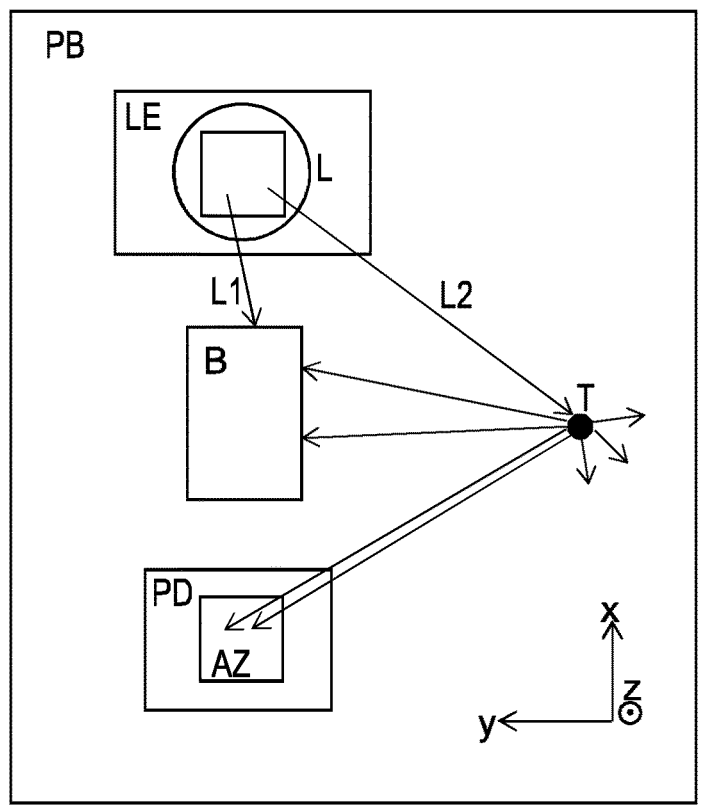
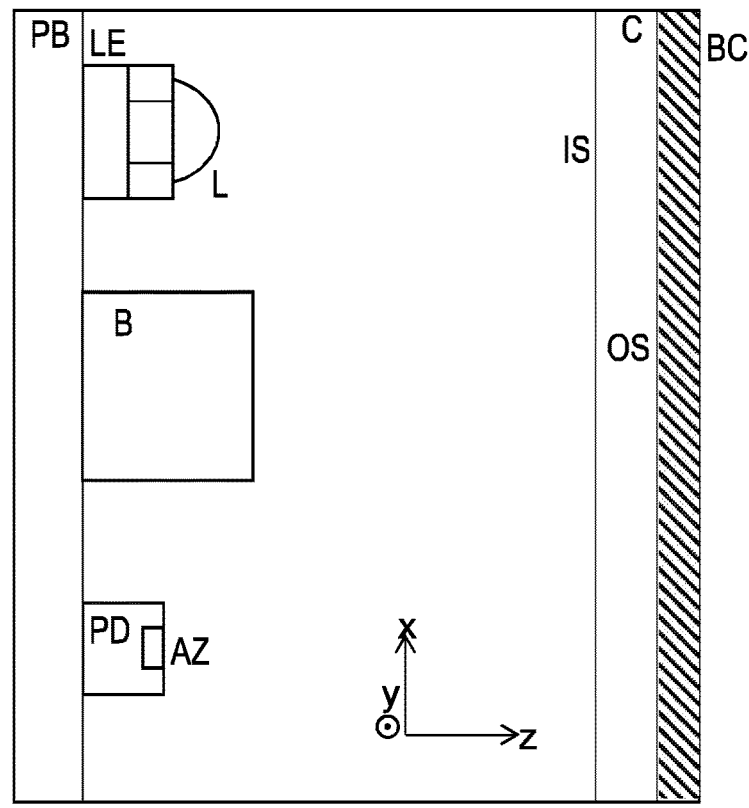

OPTICAL SENSOR ARRANGEMENT WITH OPTICAL BARRIER FOR PASSING LIGHT EMITTED BY LIGHT EMITTING DEVICE AND SCATTERED ON OR ABOVE AN OUTER SURFACE OF COVER

BACKGROUND OF THE INVENTION

Optical proximity sensors are widely used in electronic devices such as mobile phones or smartphones for detecting proximity to a human head. These sensors often use light-emitting diodes, in particular infrared light-emitting diodes, and photodetectors such as photodiodes. The sensor detects the amount of light that is reflected from the proximity target, for example the human head, as it is brought into close proximity to the sensor. Proximity detection can be used to trigger a response in the electronic device such as turning off the cell phone screen in order to conserve battery power.

One problem that occurs is optical crosstalk, since in most cases the optical proximity sensor is located behind a cover of the device, for example. This means that the photodetector detects light entering directly from the light-emitting diode or via reflection from, for example, the device cover. A common approach to reduce optical crosstalk is to design the optical arrangement such that the critical point lies outside of the device cover surface. The critical point characterizes the distance from the optical sensor below which no proximity detection is possible. Usually, the critical point is distributed in space and not an infinitesimally small point. As a consequence it can occur that there is a zone just outside the cover glass of the device where proximity detection is not possible. That means that target objects within this zone cannot be reliably detected by the sensor arrangement.

SUMMARY OF THE INVENTION

An optical sensor arrangement according to the improved concept comprises an optical barrier that is placed between a light-emitting device and a photodetector. The light-emitting device and the photodetector are arranged on a first plane and are covered by a cover.

The photodetector exhibits an active zone. The active zone is, for example, a region of the photodetector, preferably part of the top surface of the photodetector, that is sensitive to incoming light. The active zone may, for example, be a circular or a rectangular surface on top of the photodetector. A first principle axis is represented by a direction parallel to the line that connects the centers of the light-emitting device and the photodetector. The optical barrier exhibits an extent along the first principal axis that is equal or greater, preferably greater, than a dimension of the active zone of the photodetector.

The optical barrier is designed to block light emitted by the light-emitting device that otherwise would be reflected by the cover by means of specular reflection and in this way would reach the photodetector. Preferably, the optical barrier is designed to also block light that is emitted by the light-emitting device and would otherwise reach the photodetector directly. The optical barrier is further designed to pass light emitted by the light-emitting device and scattered on or above an outer surface of the cover.

A design of the optical barrier allowing for a separation of rays being reflected by the cover and rays being scattered on or above the outer surface of the cover is based on the fact that these two types of rays belong to qualitatively different paths. Rays that hit the cover and eventually may lead to optical crosstalk are reflected by the cover by means of specular reflection. The latter is specified by the conditions that means that reflected rays have to lie within the incident plane, defined by the incident ray and the normal at the point of incident on the cover, and that a reflection angle is equal to a corresponding angle of incidence. On the other hand, if light is scattered by a target on or above the outer surface of the cover the reflected rays do not necessarily lie within the incident plane and also may feature an arbitrary reflection angle. Since the possible paths for specular reflection can be determined based on the position and the geometry of the light-emitting device and the photodetector, the optical barrier can be designed to block light paths including specular reflection from the cover and to pass light paths including scattering on or above the outer surface.

Herein and hereinafter "light" generally denotes electromagnetic radiation. In preferred embodiments infrared radiation may be utilized. The cover commonly may belong to an electronic device into which the optical sensor arrangement is built. The cover may, for example, be made of a transparent material, transparent meaning essentially permeable for light emitted by the light emitting device. For example the cover may be made of glass or a plastic material.

In some embodiments of the optical sensor arrangement, the dimension of the active zone is given by a width of the active zone. The width of the active zone is hereby defined as an extent of the active zone in a direction within the first plane and perpendicular to the first principal axis. Consequently, in such embodiments the extent of the optical barrier along the first principal axis is greater than the width of active zone with respect to a direction perpendicular to the first principal axis. In preferred embodiments a width of the optical barrier, preferably its extent along a direction perpendicular to the first principal axis, is also greater than the width of the active zone. In preferred embodiments the length of the optical barrier is greater than its width.

In some embodiments, the optical barrier is designed such that there are slit openings being formed through which light being scattered on or above the outer surface of the cover can pass around the optical barrier. In this way such light can be scattered by a proximity target and after that may reach the photodetector. In particular the slit openings may be formed by a distance between the optical barrier and an aperture element.

In further embodiments, the light-emitting device emits light into a specified volume, an emission volume. In such embodiments the optical barrier is designed to intersect the emission volume such that light emitted by the light-emitting device, which otherwise would reach the photodetector directly or by means of specular reflection via the cover, is blocked. Some parts of the emission volume may correspond to rays being specularly reflected by the cover. Similarly, some parts of the emission volume may correspond to light paths where the rays do not undergo specular reflection. The optical barrier may for example be designed not to intersect such parts of the emission volume. The optical barrier may for example be designed to intersect such parts of the emission volume. In preferred embodiments the light emitting device emits light mainly into the emission volume, preferably only into the emission volume. For example the emission volume may have the shape of an emission cone.

In some embodiments of the optical sensor arrangement, the optical barrier comprises a three-dimensional column-shaped body. The optical barrier may or may not be mechanically connected to the cover. In various embodiments the light-emitting device, the photodetector and the optical barrier are arranged on the first plane, while the optical barrier extends along a direction perpendicular to the first plane. The column-shaped body may, for example, be made of a light-absorbing material. One possible shape for the column-shaped body is for example a cuboid. Another possibility is, for example, a cuboid with one of more of its lateral faces slanted or, for example, a truncated pyramid. Other possibilities for the design of the column-shaped body are for example prisms or cylinders with, for example, oval, elliptical or stadium-like basis areas. For a given arrangement and geometry of the light-emitting device and the photodetector one may, for example, employ ray tracing simulations to find an optimal solution for the shape of the column-shaped body.

In alternative embodiments according to the improved concept of the optical sensor arrangement, the optical barrier comprises an essentially two-dimensional aperture arrangement. In such embodiments, the optical barrier extends in an aperture plane which is parallel to the first plane. The aperture arrangement comprises areas that are permeable for light being emitted by the light-emitting device and other areas which are opaque with respect to the light emitted by the light-emitting device. The opaque areas may for example intersect the light paths of such rays that would otherwise be reflected by the surface of the cover and then could reach the photodetector. Preferably the opaque areas of the aperture arrangement absorb most of the light it is being hit by.

In some embodiments comprising an essentially two-dimensional aperture arrangement, the aperture plane lies between the first plane and the cover. In such embodiments, the optical barrier can, for example, be designed as part of a module shield of the sensor arrangement. The module shield is a form of an encapsulation of the proximity sensor with areas through which light emitted by the light-emitting device may leave or enter the optical sensor arrangement. The module shield may for example be made of metal or plastics with or without a coating. According to the improved concept of the optical sensor arrangement, the form of the open areas in the module shield is designed such that rays can leave the module shield, be scattered by the proximity target and re-enter the sensor arrangement, while such rays that would be reflected specularly at the cover of the device are blocked by the opaque areas of the module shield. Preferably, and in particular, this is achieved by slit openings on the sides of the aperture arrangement through which the corresponding scattering rays can enter and leave the sensor arrangement, in particular enter and leave the sensor arrangement towards the top of the sensor arrangement. In particular, the slit openings may be formed by transparent regions between the optical barrier and the rest of the module shield.

In other embodiments where the optical barrier comprises an essentially two-dimensional aperture arrangement, the latter comprises a layer of an opaque material, in particular an ink. Such opaque material is deposited on an inner and/or on the outer surface of the cover. In such embodiments, areas of the aperture arrangement that are meant to block light are covered by the opaque material while the regions of the aperture arrangement that are meant to pass light are left free of the opaque material.

Above and in the following, the term "essentially two-dimensional" accounts for the fact that it is not possible to construct a strictly two-dimensional aperature arrangement with exactly zero extension in the third direction. For example, even a layer of an ink on the cover has a certain extension in the third direction. In case it is referred to a "two-dimensional" aperture arrangement, this has to be understood as an "essentially two-dimensional" in the above sense.

In some embodiments of the optical sensor arrangement, the light-emitting device comprises for example a light-emitting diode or a laser. In particular the light-emitting device is designed to emit infrared light, for example comprising an infrared light-emitting diode or an infrared laser.

In several embodiments, the photodetector comprises a photo-sensitive diode, a charge coupled device, CCD, or a complementary metal oxide semiconductor, CMOS, component. The sensitivity range of the photodiode, the CCD or the CMOS component is chosen such that at least part of the spectrum of the light emitted by the light-emitting device can be detected by the photodetector. In preferred embodiments, the photodetector is sensitive to infrared radiation, for example for radiation in the near infrared range.

In some embodiments of the optical sensor arrangement, the light-emitting device and/or the photodetector comprise lenses. Light-emitting devices, for example light-emitting diodes, comprising lenses may be particularly suitable for the application in an optical sensor arrangement, since the lenses may, for example, allow for a more precise definition of the emission volume, in particular the emission cone of the light-emitting device. Correspondingly, lenses implemented in photodetectors allow for a more precise definition of a detection volume, in particular a detection cone of the photodetector. Consequently, light-emitting devices and/or photodetectors comprising lenses may, for example, improve the precision when defining the critical point of the optical sensor arrangement.

In some embodiments, the optical sensor arrangement, in particular the light-emitting device and/or the photodetector, are mounted on a printed circuit board, PCB. In embodiments wherein the optical barrier comprises a three-dimensional column-shaped body, the optical barrier may for example be also mounted on the same PCB. Such embodiments may be advantageous regarding the assembly of the optical sensor arrangement and the establishment of electronic connections.

In several embodiments the optical sensor arrangement further comprises the light-emitting device and the photodetector.

BRIEF DESCRIPTION OF THE DRAWINGS

In the following, the invention is explained in detail by means of exemplary embodiments with reference to the drawings.

In the drawings:

FIG. 1 shows a top view of an exemplary embodiment of an optical sensor arrangement for proximity detection;

FIG. 2 shows a side view of an exemplary embodiment of an optical sensor arrangement for proximity detection;

DETAILED DESCRIPTION

Figure 3:
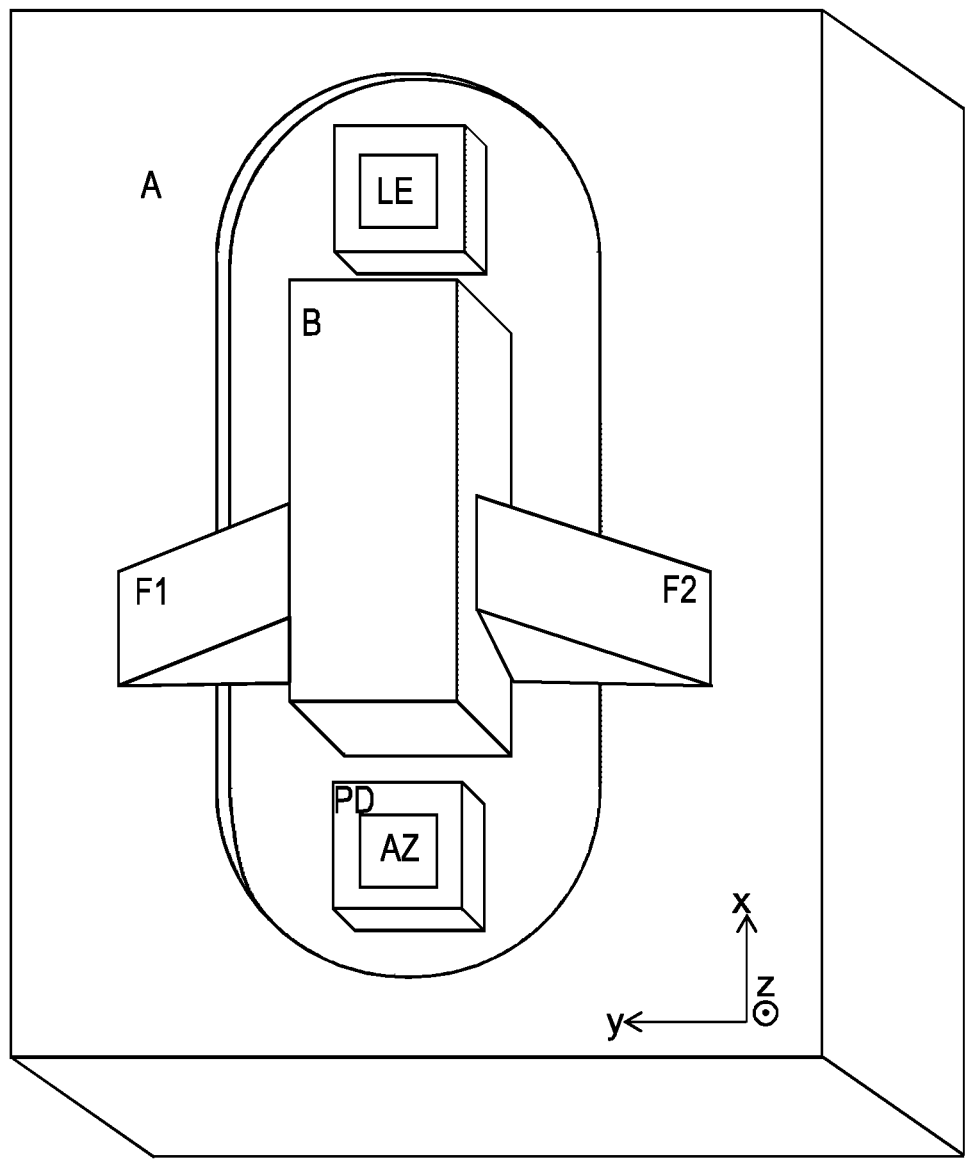
FIG. 3 shows an exemplary embodiment of an optical sensor arrangement with an optical barrier comprising a three-dimensional column-shaped body.

FIG. 1 shows a top view of an exemplary optical sensor arrangement for proximity detection according to the improved concept. The sensor arrangement comprises a light-emitting device LE, preferably an infrared light-emitting diode, and a photodetector PD, for example a charge-coupled device, CDD, a complementary metal oxide semiconductor, CMOS, component or, preferably, a photodiode. These sensor components are mounted on top of a printed circuit board, PCB, PB, to which they are electrically connected. The PCB PB defines a first plane. A first principal axis x points along the direction from the photodetector PD to the light-emitting device LE. A second principal axis y and a third principal axis z are perpendicular to the first principal axis x, such that a right-handed coordinate system is formed. Herein, the actual choice of the coordinate system is for convenience only and has no technical relevance, in particular it may be chosen differently. Furthermore, the photodetector PD exhibits an active zone AZ. The active zone AZ is a region of the photodetector PD, in particular on top of the photodetector PD, that is sensitive upon incident light.

An optical barrier B is placed between the photodetector PD and the light-emitting device LE. The optical barrier B comprises a three-dimensional body extending along the first principal axis x, the second principal axis y and the third principal axis z. Herein, "three-dimensional" means an extension not only within a plane, for example formed by the first and the second principal axes x and y, but a significant extension also along a third direction, in particular along the third principal axis z. For example, the extension of the optical barrier B along the third principal axis z may be equal or, preferably, greater than an extent of the light-emitting device LE and/or the photodetector PD along the third principal axis z. The optical sensor arrangement is covered by a cover C which is not shown in this representation (see FIG. 2). Preferably, the cover C is transparent to light being emitted by the light-emitting device LE, preferably transparent to infrared light, and for example made of glass or plastics.

The physical dimensions of the optical barrier B, the light-emitting device LE and the photodetector are not arbitrarily chosen with respect to each other. In fact, the geometry of the optical barrier is constrained by the other components and their relative positions. A guideline for choosing the actual dimensions is to achieve reliable detection of close proximity objects, for example proximity objects featuring low reflectivity, and, at the same time, reduce optical crosstalk. Furthermore, in preferred embodiments, the optical barrier B exhibits an extent L along the first principal axis x that is greater than a dimension of the active zone AZ, preferably greater than the width of the active zone AZ.

Optical crosstalk in the optical sensor arrangement may arise from specular reflections of an inner surface IS or an outer surface OS of the cover C (see FIG. 2). Specular reflections are mirror-like reflections where the angle of reflection equals the angle of incidence (classical or Snell's law of reflection). On the other hand, close proximity objects and black cards from industry standard tests constitute rather diffuse reflectors which scatter light in all directions. To account for these observations the optical barrier B is made narrow in the extent along the second principal axis y, in fact, as much as to frustrate specular reflection paths from the light-emitting device LE to the photodetector PD via the inner and outer surfaces IS, OS. In particular, the extent of the optical barrier B is made narrow enough to block all specular rays L1 reflected off the inner surface IS or the outer surface OS of the cover C (not shown).

Furthermore, the optical barrier B partially blocks an emission volume, for example an emission cone, of the light-emitting device LE. In a certain sense the photodetector PD does not see light from the light-emitting device LE by way of a direct or specularly reflected optical path. However, the optical barrier B is only so narrow (in extent along the second principal axis y) that rays are still allowed to pass around the optical barrier B by an indirectly or diffusively scattered ray. Rays reflected above the outer surface OS of the cover C can still reach the photodetector PD and lead to a proximity detection signal.

In operation, the light-emitting device LE emits or flashes rays of light L1, L2 towards the cover C. If a proximity object, for example a human head, is placed in front of the sensor arrangement, that is above an outer surface OS of the cover C, light may be reflected from the object back towards the cover C. If the light reaches, or partly reaches, the photodetector PD, a proximity event can be indicated by producing a characteristic proximity signal.

Owing to its narrow extent along the second principal axis y, the optical barrier B blocks direct and indirect optical reflection paths from the light-emitting diode LE towards the photodetector PD, as described above. If, however, light gets scattered back on or above the outer surface OS, light rays can reach the photodetector PD by means of scattering from a scattering target T, indicated as a dot in the drawing. This allows for detection of objects placed on the outer surface OS of the cover C or in close distance thereto. If a wider barrier was used, for example one that would also block indirect scattered light and not fulfilling the geometric constraints discussed above, such objects would eventually not be detectable.

FIG. 2 shows a side view of an exemplary embodiment of an optical sensor arrangement according to the improved concept. The drawing shows the sensor components arranged in the first plane, defined by the first principal axis x and the second principal axis y. The optical barrier B is placed on the PCB PB such as to reduce crosstalk between the light-emitting device LE and the photodetector PD either by direct emission or by reflection via the inner surface IS or the outer surface OS of the cover C. The optical barrier B has a certain extent along the third principal axis z which is constrained by design considerations. The actual choice of extent along the third principal axis z is made on a balance between crosstalk reduction and detection performance. The optical barrier B thus may or may not be connected with the cover C. It may be advisable to keep the extent along the third principal axis z low enough to leave a remaining gap between the barrier B and the cover C. This may prevent damaging of the sensor arrangement if some sort of force acts on the cover C. Furthermore a test target BC is shown which is attached to the outer surface OS of the cover C.

Different types of light-emitting devices LE are available. In FIG. 2 an infrared light-emitting diode is shown, having a lens L mounted on top of it. For example, the lens L can be used to focus the light emitted by the light emitting device LE, for example into a tight emission cone, such that crosstalk and divergence are low so that most rays are available for proximity detection.

The photodetector PD is matched to the light-emitting device LE in the sense that it needs to be able to detect the type of light which is emitted by the light-emitting device LE. In a preferred embodiment, the emission is in the near infrared range and common detectors may be used as most of these are sensitive in the red and infrared range. However, to improve detection further, detectors with higher sensitivity to infrared light may be used. Other wavelengths for emission and detection may be used alternatively. It is only for design reasons that infrared light may be chosen as this kind of electromagnetic radiation is invisible to the naked eye and relatively easy to implement. The general principle, however, applies to other wavelengths as well, for example ultraviolet light or visible light.

The test target BC may, for example, be a reflective black card, preferably a 5% reflective black card, placed against the cover C to simulate, for example, black hair. Such black card test targets and corresponding test conditions have been standardized by industry. A sensor arrangement passes the black card test if it produces a proximity signal under standardized conditions. The test involves a card of defined low reflectivity which simulates dark objects and is positioned on top of the cover C at zero distance.

FIG. 3 shows an exemplary embodiment of an optical sensor arrangement with an optical barrier B comprising a three-dimensional column-spaced body in a perspective view. In the shown embodiment, an aperture element A is mounted at some distance from the first plane, respectively some distance above the photodetector PD and the light-emitting device LE. The aperture element A has a stadium-like opening. Thereby, slit openings between the aperture element A and the optical barrier B are formed, through which light emitted by the light-emitting device LE can leave the sensor arrangement or light can enter the sensor arrangement from above the cover C and, for example, reach the photodetector PD. Herein the optical barrier B has the shape of a cuboid and is mounted on the first plane with an extent along the first, the second and the third principal axes x, y and z.

Additionally, a first slanted component F1 and a second slanted component F2 are mounted on top of the aperture element A and connect the aperture element A mechanically to the optical barrier B. The intention of the first and the second slanted components F1 and F2 are to increase mechanical stability of the arrangement, for example during the production, an optical effect is not intended. In particular, other embodiments may not comprise such components.

In further embodiments (not shown), the column-shaped body may, for example, feature the shape of a prism, a truncated pyramid, or a cylinder with for example an elliptical, a stadium-like or an oval base.

Figure 4:
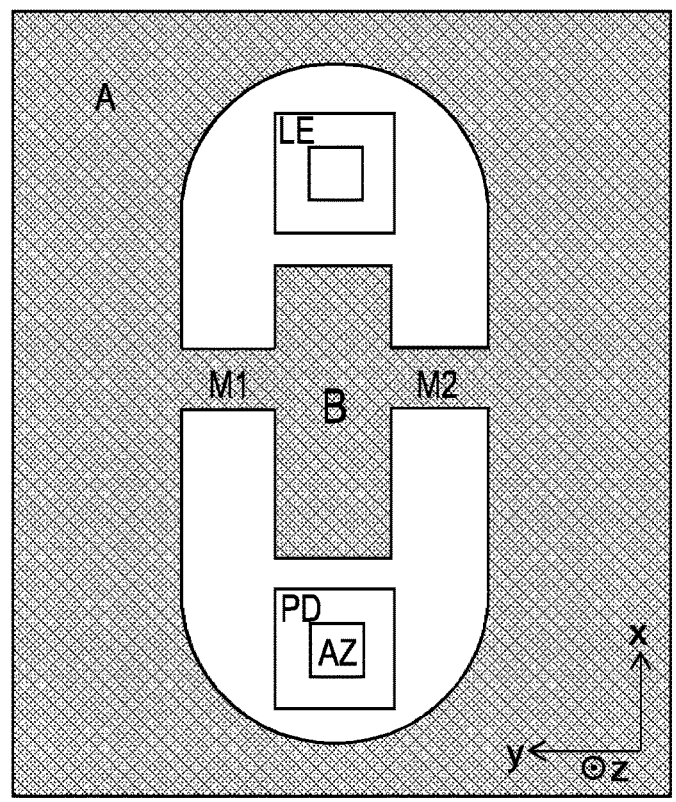
FIG. 4 shows an exemplary embodiment of an optical sensor arrangement with an optical barrier B comprising an essentially two-dimensional aperture arrangement.

FIG. 4 shows an exemplary embodiment of an optical sensor arrangement with an optical barrier B comprising an essentially two-dimensional aperture arrangement. Also here an aperture element A with a stadium-like opening is shown. The shaded regions are opaque for light being emitted by the light-emitting device LE. The white regions, forming slit openings, are transparent for light being emitted by the light emitting device LE. The positions of the light-emitting device LE and the photodetector PD are shown for a better overview. In the middle of the stadium-like opening the optical barrier B is placed, featuring the shape of a rectangle in the presented embodiment.

Furthermore, the optical barrier B is connected to the aperture element A via a first connection M1 and a second connection M2. The first and the second connections M1 and M2 are not intended to have a significant optical effect, but rather lead to an improved mechanical stability. The aperture arrangement shown in FIG. 4 may, for example, be implemented as a module shield mounted between the first plane, in particular above the light-emitting device LE and the photodetector PD, and the cover C. The module shield may for example be made of metal or plastics with or without a coating. The optically opaque material, represented by the shaded regions, preferably features a low reflectivity in order to further reduce optical crosstalk.

Figure 5:
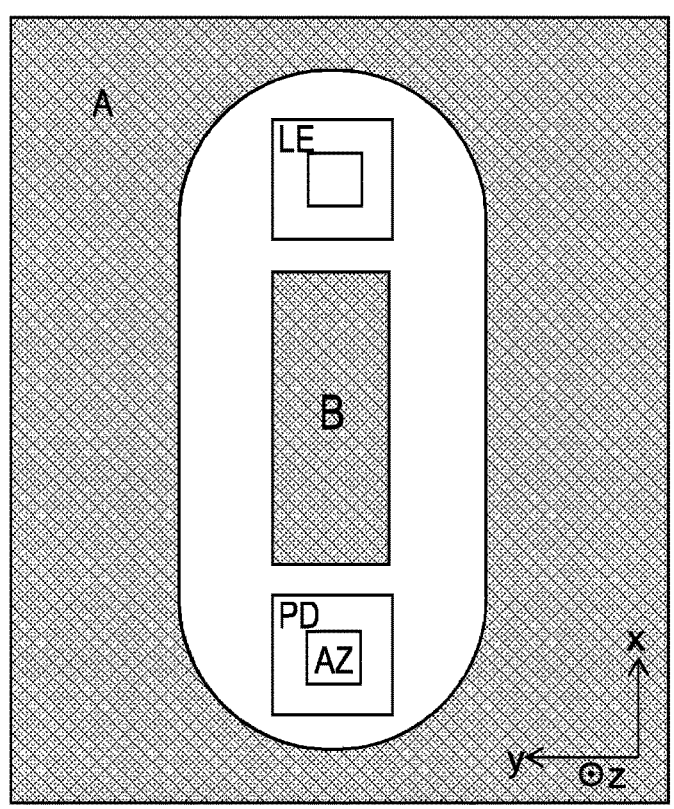
FIG. 5 shows a further exemplary embodiment of an optical sensor arrangement with an optical barrier B comprising an essentially two-dimensional aperture arrangement.

FIG. 5 shows another exemplary embodiment of an optical sensor arrangement with an optical barrier B comprising an essentially two-dimensional aperture arrangement. Also here the aperture arrangement comprises an aperture element A with a stadium-like opening. The shaded regions are opaque for light being emitted by the light-emitting device LE. The white regions, forming slit openings, are transparent for light being emitted by the light emitting device LE. The positions of the light-emitting device LE and the photodetector PD are shown for a better overview. The optical barrier B is positioned in the middle of the stadium-like opening and has the shape of a rectangle. The rectangle represents one of the most straight-forward designs for the barrier B, however, the actual design is not constrained to the one shown here. Practical shapes can, for example, be obtained from ray tracing simulations.

In the shown embodiment the aperture arrangement is basically given by a layer of an opaque material, for example an ink. The opaque material may be printed, or in an alternative way deposited, on the outer surface OS or, preferably, on the inner surface IS of the cover C. The opaque material representing the aperture element A and the optical barrier B preferably features a low reflectivity to further avoid optical crosstalk. Suitable materials may, for example, comprise black paint, inks, dyes or plastic or metal sheets. The optical barrier B, here for example the rectangular region in the middle of the stadium-like opening, is designed to block such rays that are emitted from the light-emitting device LE that would be specularly reflected, for example on the inner or the outer surface IS, OS of the cover C and would reach the photodetector PD.

The shape of the opening of the aperture element A in the optical sensors described with respect to FIGS. 3 to 5 is not restricted to a stadium-like shape. In other embodiments, the aperture element A has for example a polygonal, a rectangular, a D-shaped, an oval, a circular, an elliptical or another shape defined by line- and/or arc-segments. Consequently, the slit openings formed in the aperture arrangement as well have various corresponding shapes.

The invention claimed is:

1. An optical sensor arrangement comprising an optical barrier placed between a light emitting device and a photodetector, wherein
    the light emitting device and the photodetector are arranged on a first plane and are covered by a cover;
    the photodetector exhibits an active zone;
    the optical barrier exhibits an extent along a first principal axis parallel to the line connecting the centers of the light emitting device and the photodetector, the extent being greater than a dimension of the active zone;
    the dimension of the active zone is given by a width of the active zone, that is an extent of the active zone in a direction within the first plane and perpendicular to the first principal axis;
    the optical barrier is designed to block light emitted by the light emitting device that otherwise would be reflected by the cover by means of specular reflection and would reach the photodetector;
    the optical barrier is designed to pass light emitted by the light emitting device and scattered on or above an outer surface (OS) of the cover; and
    the optical barrier is arranged to allow for light emitted by the light emitting device and scattered on or above the outer surface of the cover to pass around the optical barrier.

2. The optical sensor arrangement according to claim 1, wherein slit openings are formed by a distance between the optical barrier and an aperture element.

3. The optical sensor arrangement according to claim 1, wherein
the light emitting device emits light into a specified emission volume; and
the optical barrier is designed to intersect the emission volume such that light emitted by the light emitting device that otherwise would reach the photodetector directly or by means of specular reflection via the cover is blocked.

4. The optical sensor arrangement according to claim 1, wherein the optical barrier comprises a three-dimensional column-shaped body.

5. The optical sensor arrangement according to claim 4, wherein
the optical barrier is arranged on the first plane; and
the optical barrier extends along a direction perpendicular to the first plane.

6. The optical sensor arrangement according to claim 1, wherein
the optical barrier comprises a two-dimensional aperture arrangement;
the optical barrier extends in an aperture plane parallel to the first plane.

7. The optical sensor arrangement according to claim 6, wherein the aperture plane lies between the first plane and the cover.

8. The optical sensor arrangement according to claim 6, wherein the aperture arrangement comprises a layer of an opaque material, in particular an ink.

9. The optical sensor arrangement according to claim 8, wherein the opaque material is deposited on an inner surface or the outer surface of the cover.

10. The optical sensor arrangement according to claim 1, wherein the light emitting device comprises a light emitting diode or a laser, in particular an infrared light emitting diode or an infrared laser.

11. The optical sensor arrangement according to claim 1, wherein the photodetector comprises a photo-diode, a charge coupled device, CCD, or a complementary metal oxide semiconductor, CMOS, component.

12. The optical sensor arrangement according to claim 1, wherein the light emitting device and/or the photodetector comprise lenses.

13. The optical sensor arrangement according to claim 1, wherein the light emitting device and/or the photodetector are mounted on a printed circuit board, PCB.

14. The optical sensor arrangement according to claim 1, further comprising the light emitting device and/or the photodetector.

15. The optical sensor arrangement according to claim 1, wherein the optical barrier is arranged to allow for light emitted by the light emitting device and scattered on the outer surface and for light emitted by the light emitting device and scattered above the outer surface to pass around the optical barrier.

16. The optical sensor arrangement according to claim 1, wherein the optical barrier is arranged to allow for light emitted by the light emitting device and scattered on or above the outer surface to pass around the optical barrier by passing through slit openings.

* * * * *